(12) United States Patent
Han et al.

(10) Patent No.: US 8,877,651 B2
(45) Date of Patent: Nov. 4, 2014

(54) SEMICONDUCTOR DEVICE AND MANUFACTURING METHOD INVOLVING MULTILAYER CONTACT ETCH STOP

(75) Inventors: Qiuhua Han, Beijing (CN); Xinpeng Wang, Beijing (CN); Yi Huang, Beijing (CN)

(73) Assignee: Semiconductor Manufacturing International (Beijing) Corporation (CN)

( * ) Notice: Subject to any disclaimer, the term of this patent is extended or adjusted under 35 U.S.C. 154(b) by 242 days.

(21) Appl. No.: 13/326,161

(22) Filed: Dec. 14, 2011

(65) Prior Publication Data
US 2013/0043516 A1 Feb. 21, 2013

(30) Foreign Application Priority Data
Aug. 16, 2011 (CN) .......................... 2011 1 0233890

(51) Int. Cl.
*H01L 21/306* (2006.01)
*H01L 21/768* (2006.01)
*H01L 29/78* (2006.01)

(52) U.S. Cl.
CPC .... *H01L 21/76802* (2013.01); *H01L 21/76832* (2013.01); *H01L 21/76834* (2013.01)
USPC .............................. 438/720; 257/640; 257/637

(58) Field of Classification Search
CPC ................................................ H01L 21/76832
USPC .................................. 438/720; 257/640, 637
See application file for complete search history.

(56) References Cited

U.S. PATENT DOCUMENTS

| 5,025,295 A * | 6/1991 | Kuesters et al. ............... 257/301 |
| 6,635,576 B1 * | 10/2003 | Liu et al. ........................ 438/700 |
| 6,841,851 B2 * | 1/2005 | Jung .............................. 257/640 |
| 2008/0017930 A1 * | 1/2008 | Kim et al. ..................... 257/369 |
| 2008/0230917 A1 | 9/2008 | Chou et al. |
| 2009/0166814 A1 * | 7/2009 | Hohage et al. ................ 257/640 |
| 2010/0264412 A1 * | 10/2010 | Yamazaki et al. ............. 257/43 |
| 2010/0276790 A1 * | 11/2010 | Hohage et al. ................ 257/640 |
| 2010/0285668 A1 * | 11/2010 | Richter et al. ................ 438/703 |
| 2010/0327362 A1 * | 12/2010 | Richter et al. ................ 257/368 |
| 2011/0108930 A1 * | 5/2011 | Cheng et al. .................. 257/412 |
| 2011/0151674 A1 * | 6/2011 | Tang et al. .................... 438/715 |
| 2011/0303913 A1 * | 12/2011 | Yamazaki et al. ............. 257/43 |

FOREIGN PATENT DOCUMENTS

CN 102110611 A 6/2011

* cited by examiner

*Primary Examiner* — Michael Jung
*Assistant Examiner* — John P Dulka
(74) *Attorney, Agent, or Firm* — Innovation Counsel LLP

(57) ABSTRACT

A method for manufacturing a semiconductor device includes forming a contact etch stop layer on an active area of a substrate that has a gate stack formed thereon. The gate stack includes a metal gate and a metal oxide. The contact etch stop layer includes a silicon oxide layer sandwiched between a first silicon nitride layer and a second silicon nitride layer that is disposed on the active area. The method further includes forming a contact hole extending through an interlayer dielectric layer on the first silicon nitride layer using the first silicon nitride layer as a protection for the active area, removing a portion of the first silicon nitride layer disposed at the bottom of the contact hole using the silicon oxide layer as a protection for the active area, and removing the metal oxide using the second silicon nitride layer as a protection for the active area.

14 Claims, 10 Drawing Sheets

SEMICONDUCTOR DEVICE AND MANUFACTURING METHOD INVOLVING MULTILAYER CONTACT ETCH STOP

CROSS-REFERENCE TO RELATED APPLICATIONS

This application claims priority to Chinese Patent Application No. 201110233890.7, filed on Aug. 16, 2011 and entitled "SEMICONDUCTOR DEVICE AND MANUFACTURING METHOD THEREOF", which is incorporated herein by reference in its entirety.

BACKGROUND OF THE INVENTION

1. Field of the Invention

The present invention relates generally to semiconductor processing technology, and more particularly, to a semiconductor device and manufacturing method thereof.

2. Description of the Related Art

In semiconductor processes, after etching a contact hole over a metal gate, the metal gate exposed to air trends to form metal oxide. For example, aluminum (AL) exposed to air trends to form aluminum oxide. It is hard to remove the metal oxide formed on the metal gate.

FIG. 1A and FIG. 1B show a sequence of cross sectional views illustrating a conventional method of forming a metal gate in a semiconductor device. As shown in FIG. 1A, a semiconductor device has a contact hole 106 formed over a metal gate 102 and a contact hole 108 formed over an active area 104. As further shown in FIG. 1A, a surface of the metal gate 102 and a surface of the active area are exposed after forming the contact holes 106 and 108. The surface of the metal gate 102 exposed to air will form metal oxide which should be removed. Referring next to FIG. 1B, the metal oxide formed on the metal gate 102 is removed. Removing the metal oxide on the metal gate 102 can result in an undesired removal of a portion of a material (such as metal silicide region 104) at the bottom of the contact hole 108, thereby degrading the performance of the semiconductor device.

BRIEF SUMMARY OF THE INVENTION

The inventor of the present invention has studied the problems described above and herein proposes a novel technical solution to address at least one of these problems.

An object of the present invention is to provide a method of manufacturing a semiconductor device. The method includes forming a contact etch stop layer on an active area of a semiconductor substrate, wherein a gate stack having a metal gate and a metal oxide disposed on the metal gate is formed on the semiconductor substrate. The contact etch stop layer includes a first silicon nitride layer overlying a silicon oxide layer, a second silicon nitride layer overlying the active area, and the silicon oxide layer is sandwiched between the first and second silicon nitride layers. The method further includes forming a contact hole that extends through an interlayer dielectric layer overlying the first silicon nitride layer by etching using the first silicon nitride layer as a protective layer for the active area, removing a portion of the first silicon nitride layer being exposed at the bottom of the contact hole using the silicon oxide layer as a protection layer for the active area, and removing the metal oxide on the metal gate using the second silicon nitride layer as a protection layer for the active area.

In an embodiment, the first silicon nitride layer can have a thickness of 200-400 Å, the second silicon nitride layer can have a thickness of 50-100 Å, the silicon oxide layer can have a thickness of 50-100 Å.

In an embodiment, the removing of the metal oxide on the metal gate can comprise a sputtering process. The sputtering process may include a physical vapor deposition process including a radio frequency power of 100-500 W, a bias voltage of 100-300V, an argon flow rate of 2-3 sccm, and a process time of 10-100 seconds.

In an embodiment, after removing the metal oxide on the metal gate, the method further includes removing a portion of the second silicon nitride layer that is disposed at the bottom of the contact hole by a SiCoNi pre-clean process to expose a surface of the active area.

In an embodiment, the SiCoNi pre-clean process can comprise a flow rate of fluorin nitride of 10-30 sccm, a flow rate of ammonia of 30-100 sccm, a pressure of 2-10 Torr, a power of 10-100 w, and a process time of 10-100 seconds.

In an embodiment, the active area can include a preformed metal silicide region, and the exposed surface of the active area is formed in the metal silicide region.

In an embodiment, the SiCoNi pre-clean process comprises an oxide to silicon nitride selectivity ratio of less than 5:1

Another object of the present invention is to provide a semiconductor device which can include a semiconductor substrate having an active area, wherein a gate stack including a metal gate is formed on the semiconductor substrate; a contact etch stop layer covering the active area, the contact etch stop layer including a first silicon nitride layer overlying a silicon oxide layer, a second silicon nitride layer overlying the active area, the silicon oxide layer being sandwiched between the first and second silicon nitride layers; and a contact hole through the contact etch stop layer, wherein the contact hole is formed over the active area.

In an embodiment, the first silicon nitride layer can have a thickness of 200-400 Å, the second silicon nitride layer can have a thickness of 50-100 Å, the silicon oxide layer can have a thickness of 50-100 Å.

In an embodiment, the active area can comprise a preformed metal silicide region, and the contact hole is formed over the metal silicide region.

In an embodiment, the gate stack can comprise a gate dielectric layer overlying the active area, and the metal gate overlying the gate dielectric layer, and the gate dielectric layer comprises a high-k material.

In an embodiment, the contact hole can be filled with a conductive material.

Embodiments of the present invention can provide the following advantages: By using the contact etch stop layer, the loss of the surface material exposed at the bottom of the contact hole over the active area can be reduced while removing the metal oxide on the metal gate, which can further improve the performance of the semiconductor device.

Additional features and advantages of the present invention will become apparent from the following detailed description of exemplary embodiments with reference to the accompanying drawings.

BRIEF DESCRIPTION OF THE DRAWINGS

The accompanying drawings, which are incorporated in and constitute a part of the specification, illustrate embodiments of the invention and, together with the description, serve to explain the principles of the invention, wherein.

DETAILED DESCRIPTION OF THE INVENTION

Figure 1A:
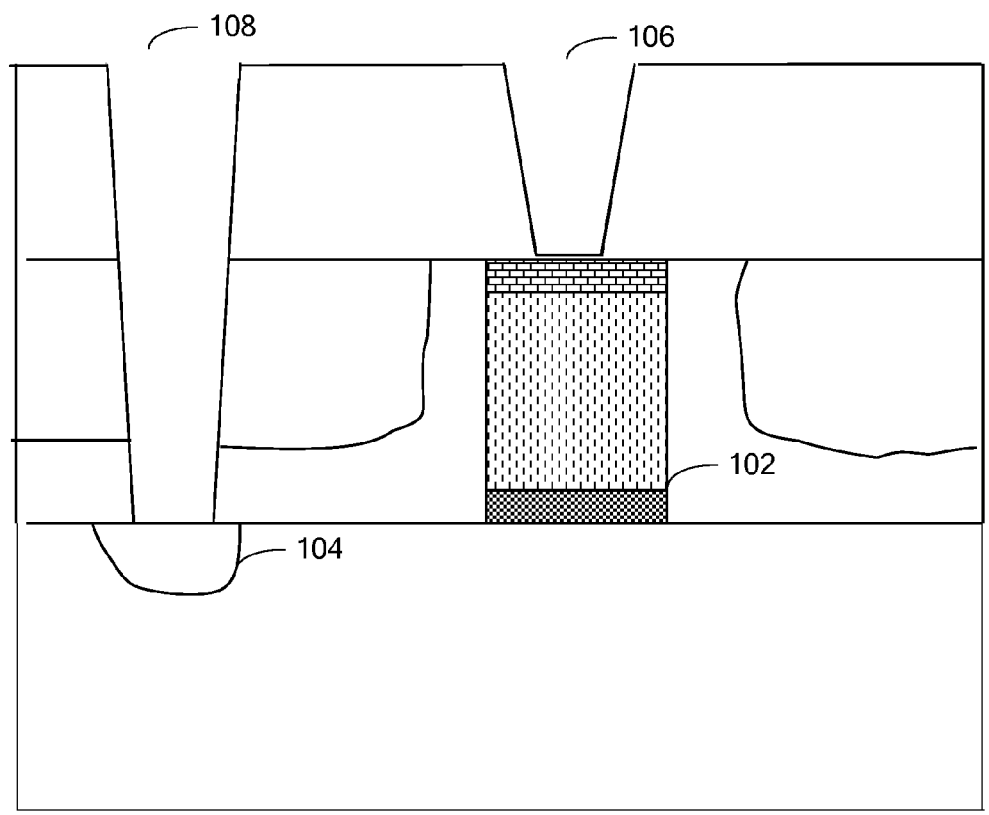
FIG. 1A and FIG. 1B are sectional views illustrating intermediate stages of a semiconductor device, as known in the prior art.
Figure 1B:
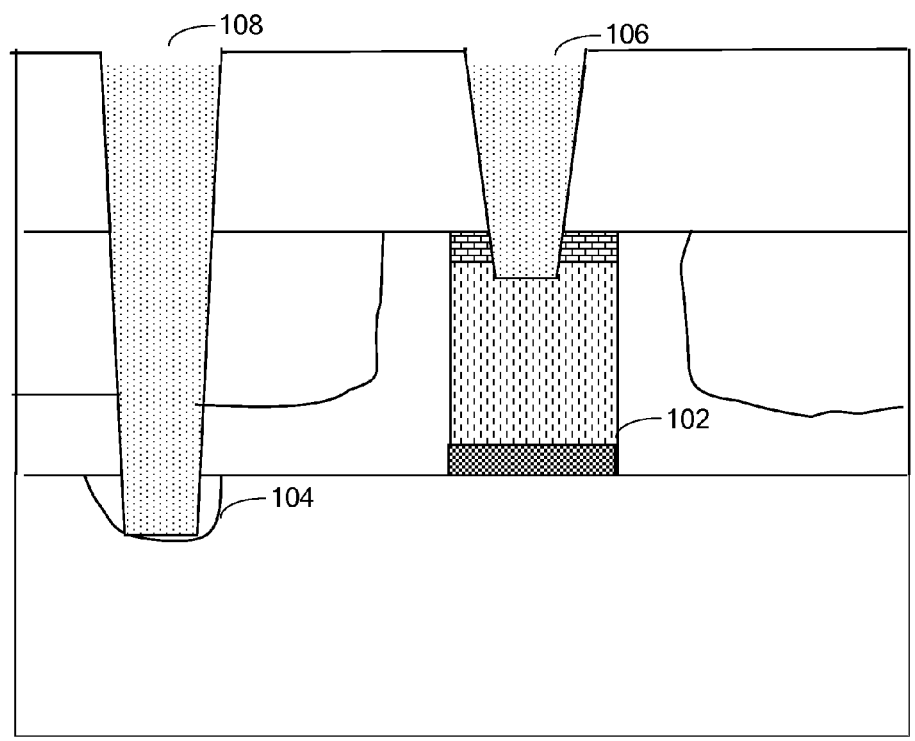

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

It is to be noted that, in the accompanying drawings, for convenience of description, the sizes of respective components may not be drawn to scale.

The following description of at least one exemplary embodiment is merely illustrative in nature and is not intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Figure 2:
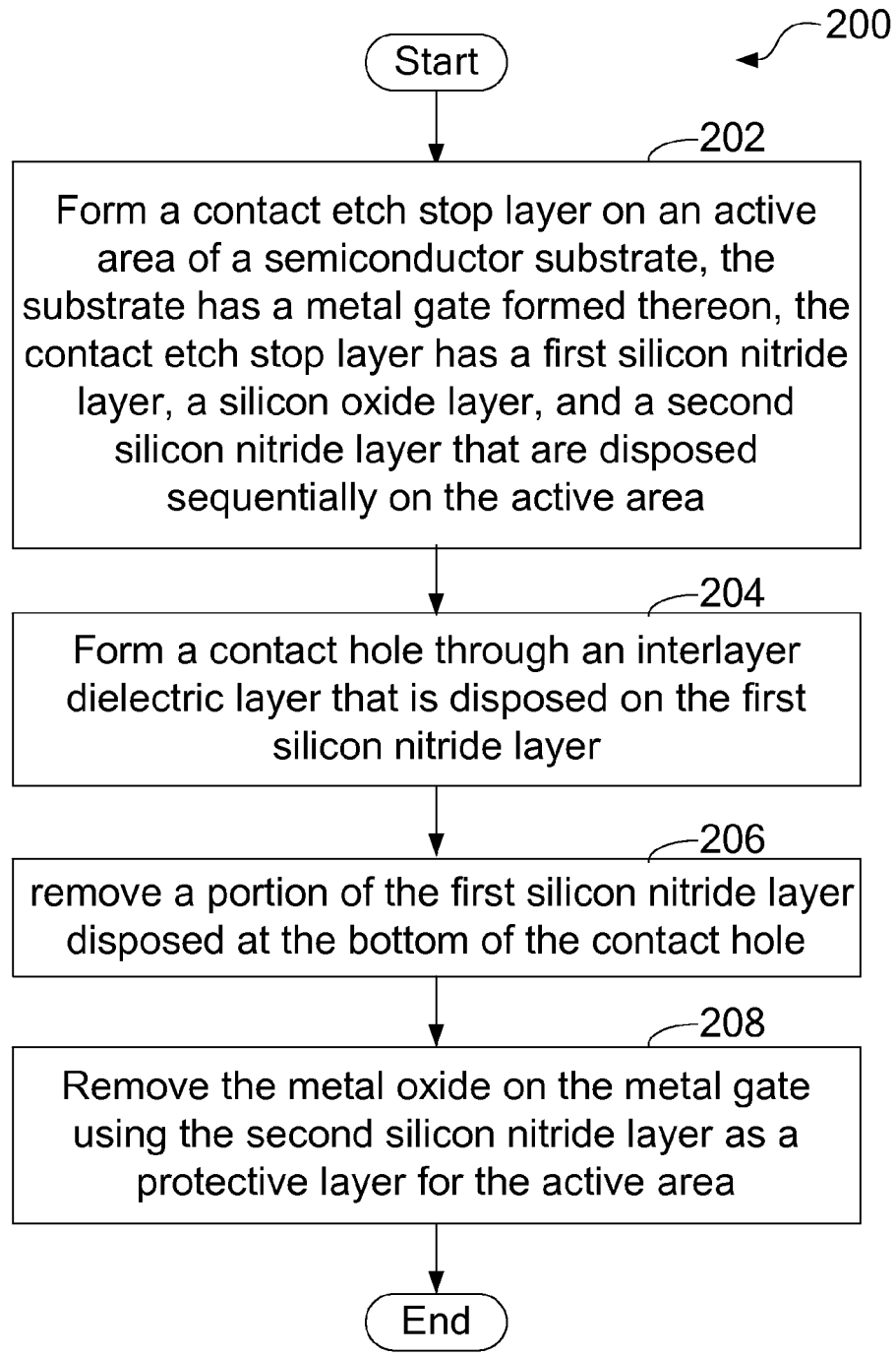
FIG. 2 is a flowchart showing a method of manufacturing a semiconductor device in accordance with an embodiment of the present invention.

FIG. 2 is a flowchart showing a method 200 of manufacturing a semiconductor device in accordance with an embodiment of the present invention.

At step 202, a contact etch stop layer can be formed on an active area of a semiconductor substrate. There is a gate stack formed on the semiconductor substrate. The gate stack includes a metal gate and a metal oxide on the metal gate. The contact etch stop layer can include a first silicon nitride layer overlying a silicon oxide layer, a second silicon nitride layer overlying the active area, the silicon oxide layer is sandwiched between the first and second silicon nitride layers.

At step 204, a contact hole extending through an interlayer dielectric layer overlying the first silicon nitride layer can be formed by etching using the first silicon nitride layer as a protective layer for the active area. The contact hole for the source/drain region and/or the metal gate can be used for connecting transistors and wiring.

At step 206, a portion of the first silicon nitride layer that is disposed at the bottom of the contact hole can be removed using the silicon oxide layer as a protective layer for the active area.

At step 208, the metal oxide on the metal gate can be removed using the second silicon nitride layer as a protective layer for the active area.

In one embodiment of the present invention, in the process of contact etching and the subsequent process of removing the metal oxide on the metal gate, the contact etch stop layer can reduce the loss of the surface material of the active area that is disposed at the bottom of the contact hole. For example, when the surface of the active area is the surface of a metal silicide region which can be protected by the contact etch stop layer, in order to reduce the contact resistance of the contact hole and source/drain regions, and to further improve the performance of the semiconductor device.

Figure 3:
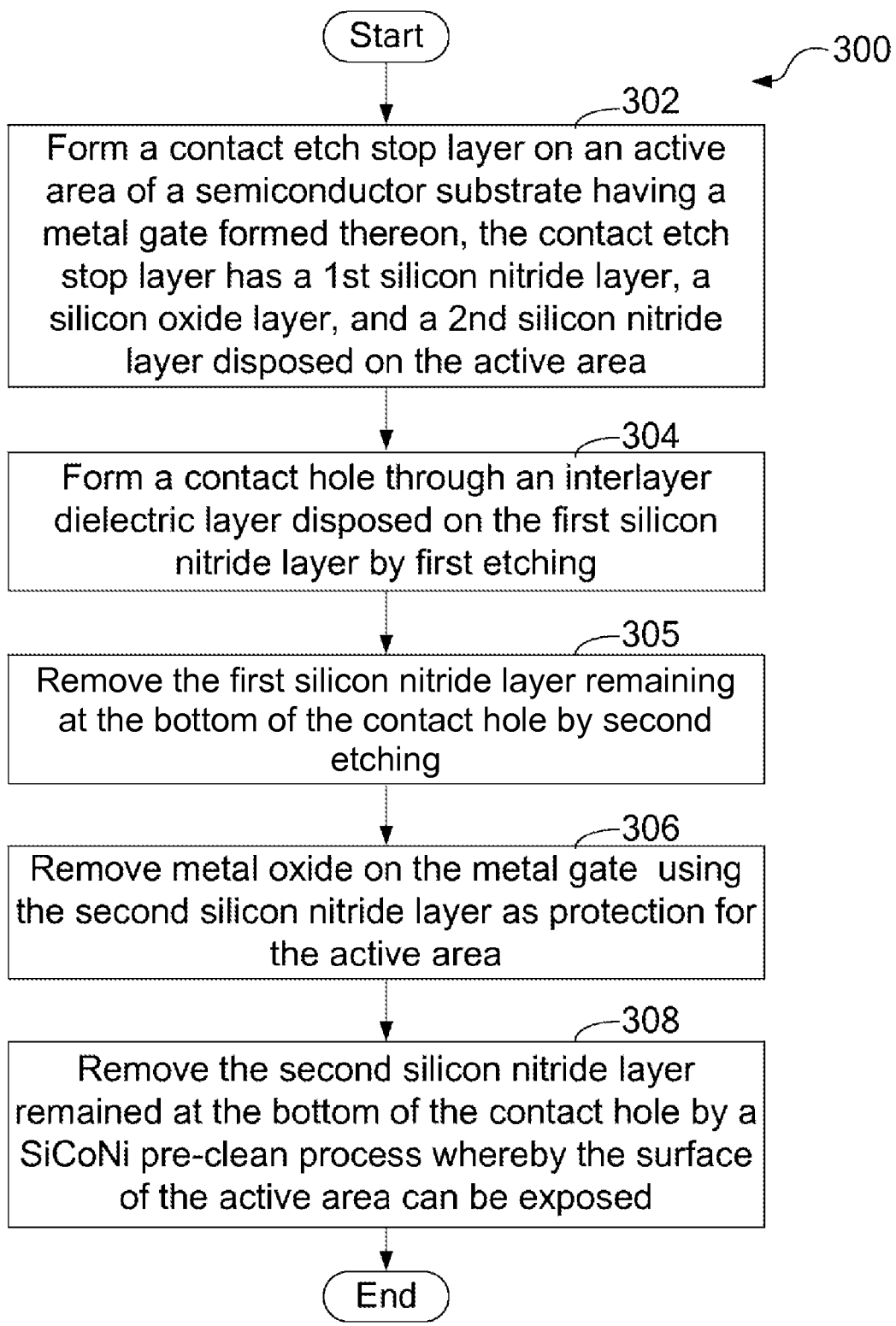
FIG. 3 is a flowchart showing a method of manufacturing a semiconductor device in accordance with another embodiment of the present invention.

FIG. 3 is a flowchart showing a method 300 of manufacturing a semiconductor device in accordance with another embodiment of the present invention.

At step 302, a contact etch stop layer can be formed on an active area of a semiconductor substrate. There is a gate stack formed on the semiconductor substrate. The gate stack includes a metal gate and a metal oxide overlying the metal gate. The contact etch stop layer can include a first silicon nitride layer, a silicon oxide layer underlying the first silicon nitride layer and a second silicon nitride layer underlying the silicon oxide layer.

In one embodiment, the first silicon nitride layer can have a thickness of 200-400 Å, the second silicon nitride layer can have a thickness of 50-100 Å, and the silicon oxide layer can have a thickness of 50-100 Å.

At step 304, a contact hole extending through an interlayer dielectric layer overlying the first silicon nitride layer can be formed by a first etching. The first silicon nitride layer can be used as a protection layer for the active area. The interlayer dielectric layer can include the first and second interlayer dielectric layers. The interlayer dielectric layer can be formed by chemical vapor deposition, spin coating, physical vapor deposition or other processes. After the interlayer dielectric layer is formed, the process of chemical mechanical planarization can be employed to planarize the surface of the semiconductor device.

At step 305, a portion the first silicon nitride layer being disposed at the bottom of the contact hole can be removed by a second etching. The silicon oxide layer can be used as a protective layer for the active area at this step. That is, the second etching can be stopped by the silicon oxide layer. In one embodiment, the process of dry etch or plasma etch can be used for etching the contact hole.

At step 306, the metal oxide on the metal gate can be removed using the second silicon nitride layer as a protective layer for the active area. When removing the metal oxide on the metal gate, the silicon oxide layer and a portion of the second silicon nitride layer of the contact etch stop layer can be consumed. The rest of the second silicon nitride layer can protect the active area when removing the metal oxide on the metal gate. In addition, the second silicon nitride layer can guarantee the tension of the contact etch stop layer in order to further improve the performance of the semiconductor device. In one embodiment, the metal oxide on the metal gate can be removed by sputtering. The process of physical vapor deposition can be used for sputtering. The physical vapor deposition can include the following processes and parameters: applying a radio frequency having a power in the range of 100-500 W, a bias voltage of 100-300V, an argon flow rate of 2-3 sccm, and with a process time of 10-100 seconds.

At step 308, a portion of the second silicon nitride layer remained at the bottom of the contact hole over the active area can be removed by a SiCoNi pre-clean process whereby the surface of the active area can be exposed. In one embodiment, the active area can include a preformed metal silicide region, and the exposed surface of the active area can be in the metal silicide region. The metal silicide region can reduce the contact resistance of the contact hole and the source/drain regions, and form ohmic contact. In an embodiment, the metallic material for forming the silicide can be Ti, Pt, W, Ta, Ni, Co, and the like.

The process and the chamber of the SiCoNi pre-clean process can be used for solving the problem of transistor contacts in semiconductor processes. A method of chemical etch with low intensity can be provided by the SiCoNi pre-clean process for removing oxide film from the surface of nickel silicide and cobalt silicide. The SiCoNi pre-clean process provide the following advantages and benefits: since the wafer can be sent into a nickel deposition chamber after its surface has been processed under high vacuum, the queue time to transfer the wafer among different mechanical hardware can be eliminated; spike defects often occurring in the HF dip wet process can be eliminated; the SiCoNi pre-clean process provides high selective removal of silicon oxide, which reduces the loss of the silicon substrate and changes of the shape of the silicon substrate. Moreover, the SiCoNi pre-clean process can provide lower leakage current and contact resistance distribution is more concentrated. More even silicide takes advantage of better processing the interface of nickel and silicon.

In addition, the SiCoNi pre-clean process can also be used for several clean processes for the surface of silicon or material including silicon. In one embodiment, by adjusting the process parameters, the SiCoNi pre-clean process can be used for removing a portion of the silicon nitride layer being exposed at the bottom of the contact hole on the surface of metal silicide (e.g., nickel silicide). For example, in the SiCoNi pre-clean process, the SiCoNi pre-clean process comprises an oxide to silicon nitride selectivity ratio of 5:1 or less. In one embodiment, the SiCoNi pre-clean process can comprise a flow rate of fluorin nitride of 10-30 sccm, a flow rate of ammonia of 30-100 sccm, a pressure of 2-10 Torr, a power of 10-100 W, and a process time of 10-100 seconds.

Figure 4:
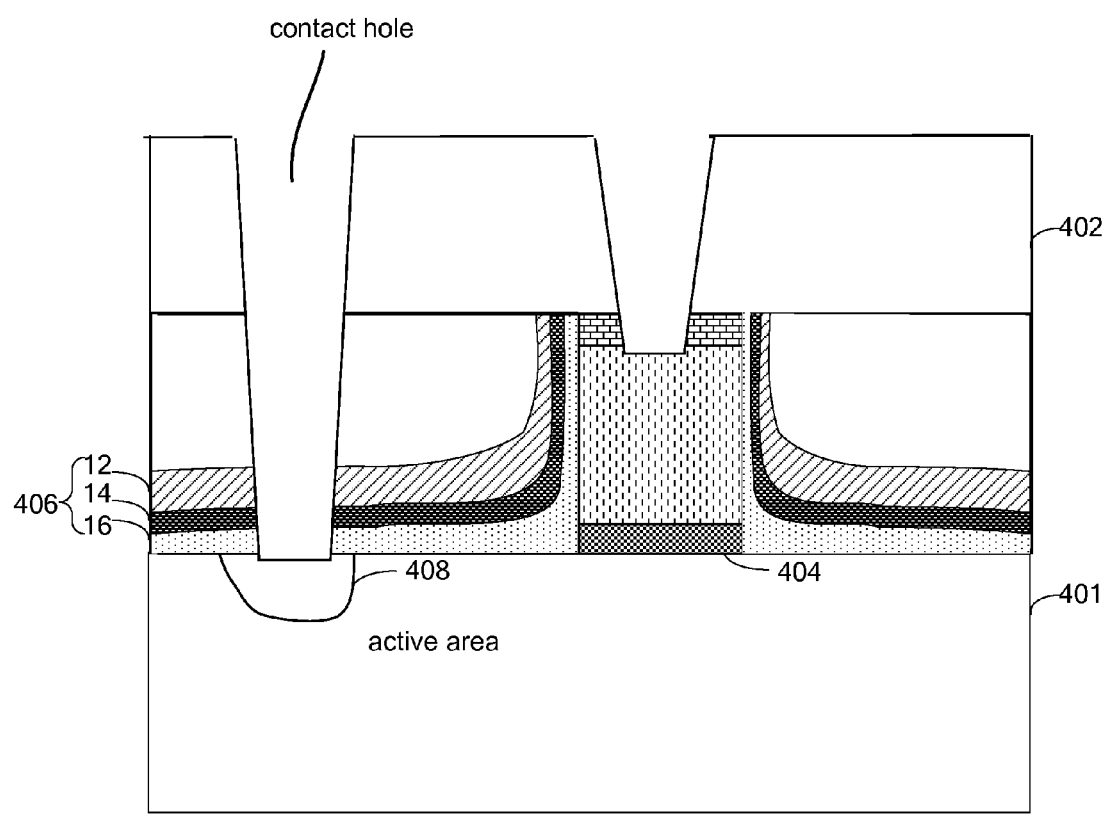
FIG. 4 is a sectional view of a semiconductor device in accordance with an embodiment of the present invention.

FIG. 4 is a cross-sectional view illustrating a semiconductor device in accordance with an embodiment of the present invention. The semiconductor device after being processed by the manufacturing method according to an embodiment of the present invention can include a semiconductor substrate 401 having an active area, a gate stack 404 including a metal gate on the semiconductor substrate, a contact etch stop layer 406 on the active area, an interlayer dielectric layer 402 on the gate stack and on the contact etch stop layer, and a contact hole through the interlayer dielectric layer and the contact etch stop layer 406.

On the semiconductor substrate 401, there is the gate stack 404. The contact etch stop layer 406 which covers the active area includes a first silicon nitride layer 12 disposed on a silicon oxide layer 14 that, in turn, is disposed on a second silicon nitride layer 16 that is disposed on the active area of the semiconductor substrate. The silicon oxide layer 14 is sandwiched between the first and second silicon nitride layers. The contact hole through the contact etch stop layer 406 can be formed over the active area. In one embodiment, the active area can include a preformed metal silicide region 408. The active area exposed at the bottom of the contact hole can be formed in a metal silicide region 408.

FIG. 5A through FIG. 5E are a sequence of cross-sectional views illustrating a method of manufacturing a semiconductor device in accordance with an embodiment of the present invention. As shown in FIG. 5A-FIG. 5E, the semiconductor device can include: a semiconductor substrate 501 with an active area, an interlayer dielectric layer 502, a gate stack 504, a contact etch stop layer 506 and a metal silicide region 508.

Figure 5A:
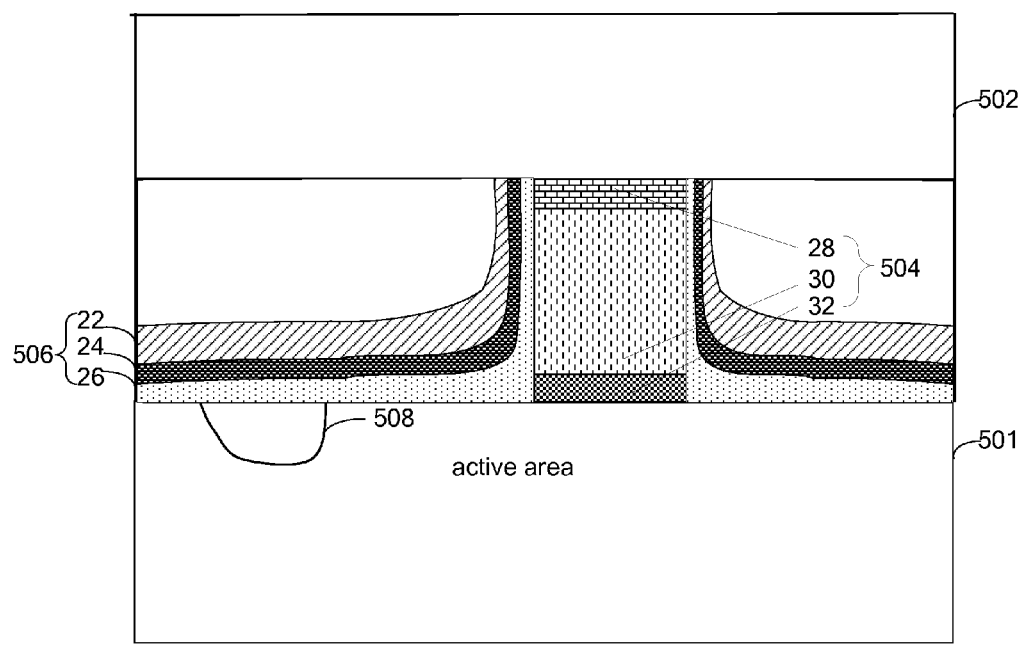
FIG. 5A through FIG. 5E are cross sectional views of a semiconductor device formed respectively at each step of a method of manufacturing a semiconductor device in accordance with an embodiment of the present invention.

FIG. 5A is a sectional view of the semiconductor device before etching contact holes. On the semiconductor substrate 501, there is the gate stack 504. The contact etch stop layer 506 which covers the active area can include a first silicon nitride layer 22, a silicon oxide layer 24 under the first silicon nitride layer 22 and a second silicon nitride layer 26 under the silicon oxide layer 24. In one embodiment, the first silicon nitride layer 22 can have a thickness of 200-400 Å, the second silicon nitride layer 26 can have a thickness of 50-100 Å, the silicon oxide layer 24 can have a thickness of 50-100 Å.

In one embodiment, the active area can include a preformed metal silicide region 508 which can be used for forming ohmic contact so as to reduce the contact resistance of the contact hole and the source/drain region.

In one embodiment, the gate stack 504 can include a gate dielectric layer 32 overlying the active area and the metal gate 30 overlying the gate dielectric layer 32. The gate dielectric layer 32 can comprise high-k material.

Since silicon dioxide is easy to be manufactured, the depth of which can be reduced for improving the performance of the semiconductor device, it is conventional material for gate dielectric layer. As technology progresses, e.g. in the 65 nm manufacturing process, the depth of the gate dielectric layer made of silicon dioxide reduced to 1.2 nm. However, as size of transistors reduces, power consumption and heat emission increase at the same time, which may waste power and cause undesired heat. If the present material is used, and its depth is further reduced, the situation of the leakage current of the gate dielectric will be worse, which will limit the small transistor technology. Therefore, thicker material with high-k material (e.g., hafnium-based material) can be used as the gate dielectric, which can reduce the leakage current by more than 10 times.

Figure 5B:
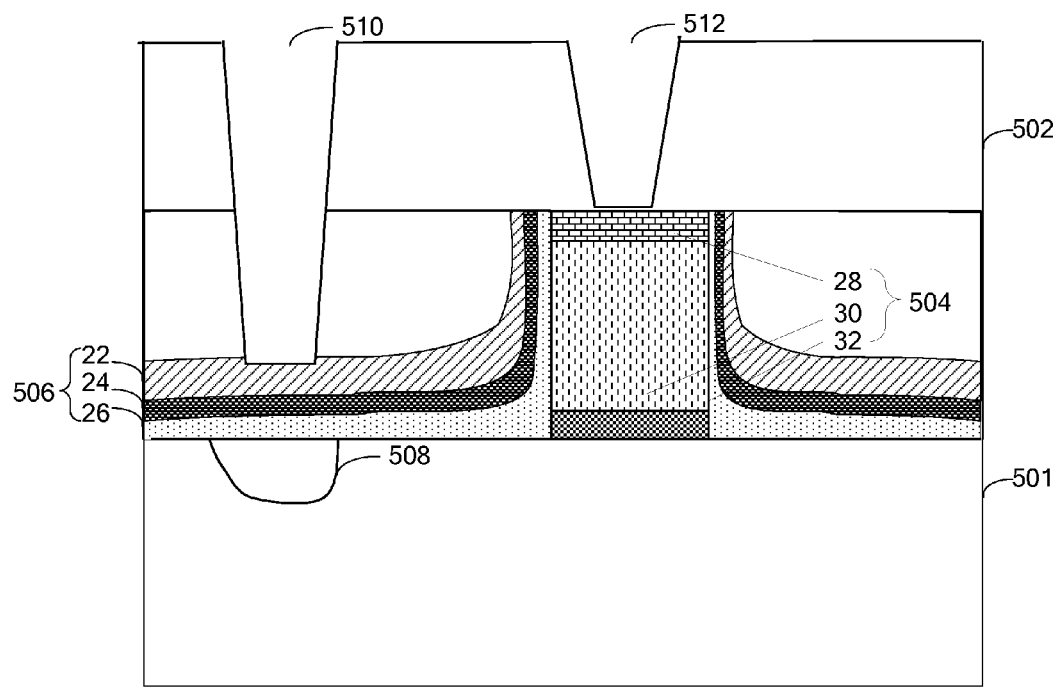

FIG. 5B is a sectional view of the semiconductor device after the first etching on the gate stack 504 and the active area 508. A contact hole 510 through the interlayer dielectric layer 502 on the first silicon nitride layer 22 and a contact hole 512 through the interlayer dielectric layer 502 over the gate stack 504 can be formed. The first silicon nitride layer 22 can protect the active area during the first etching.

Figure 5C:
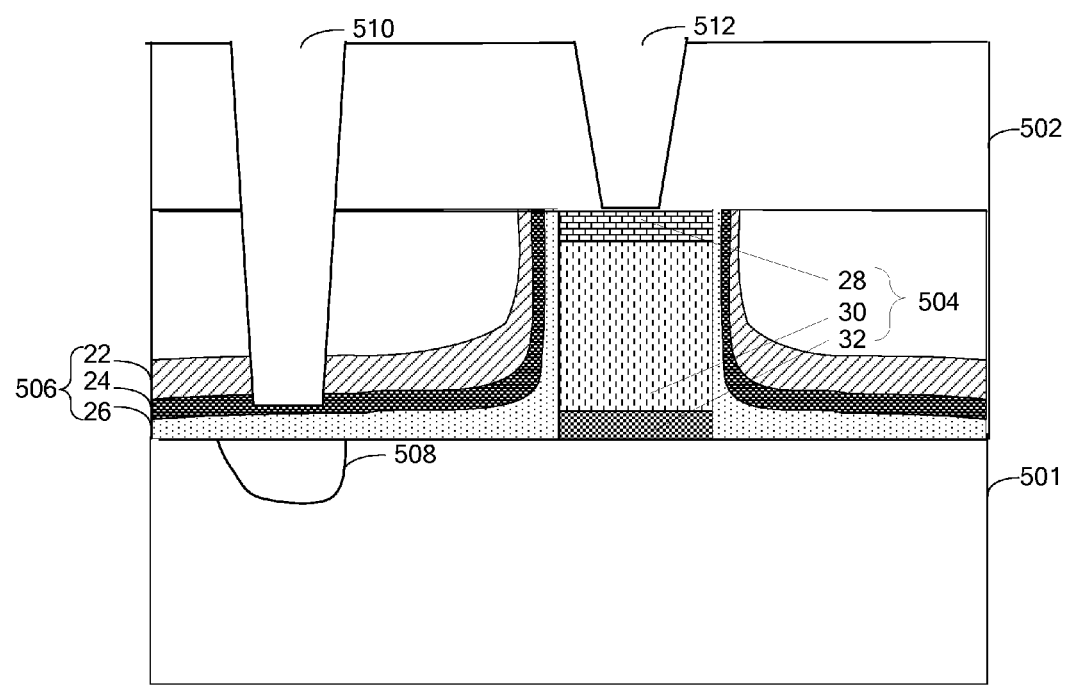

FIG. 5C is a sectional view of the semiconductor device after the second etching on the gate stack 504 and the active area. The first silicon nitride layer 22 remained at the bottom of the contact hole 510 can be removed while the silicon oxide layer 24 can protect the active area. The second etching can be stopped at the silicon oxide layer 24.

Figure 5D:
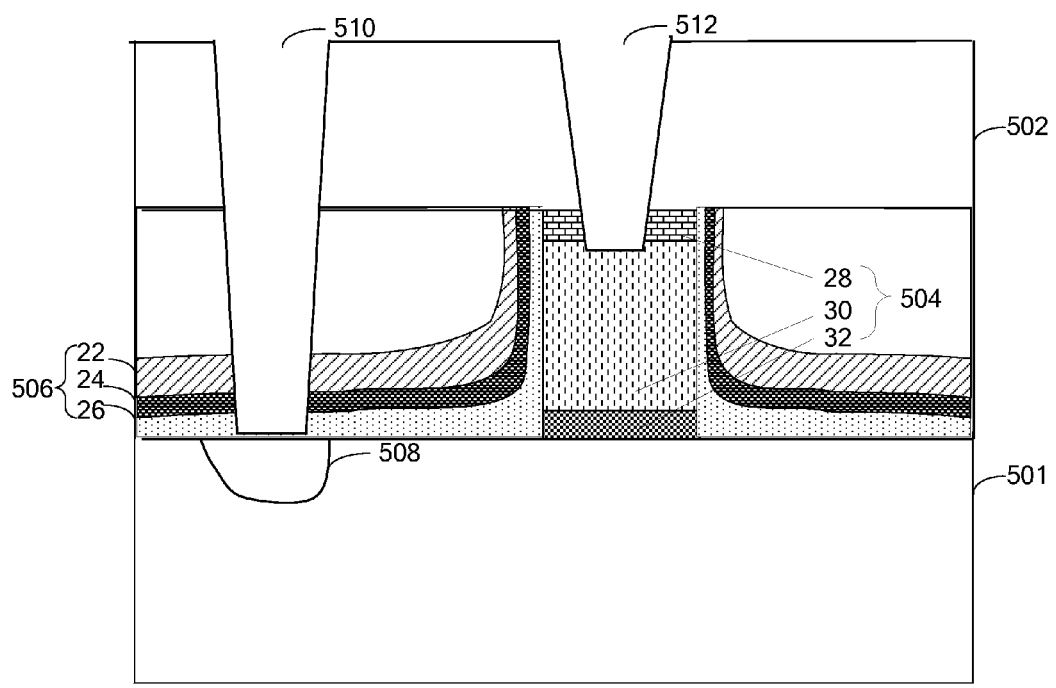

FIG. 5D is a sectional view of the semiconductor device after removing the metal oxide 28 on the metal gate 30 of the gate stack 504. As shown in FIG. 5D, the silicon oxide layer 24 and part of the second silicon nitride layer 26 are consumed while removing the metal oxide 28. The remained part of the second silicon oxide 26 can protect the active area for reducing the loss of the surface material of the active area. In one embodiment, the active area can include the preformed metal silicide region 508. The active area exposed at the bottom of the contact hole 510 can be in the metal silicide region 508. The metal silicide region 508 can be protected by the contact etch stop layer 506 while removing the metal oxide 28, so as to reduce the loss of the metal silicide region 508. The character of the metal silicide for reducing the contact resistance of the contact hole and source/drain region can be guaranteed, and furthermore the performance of the semiconductor device can be improved.

In one embodiment, the metal oxide 28 on the metal gate 30 can be removed by sputtering. The process of physical vapor deposition can be used for sputtering. The parameters for physical vapor deposition can include: a radio frequency power of 100-500 W, a bias voltage of 100-300V, a argon flow rate of 2-3 sccm, and a process time of 10-100 seconds.

Figure 5E:
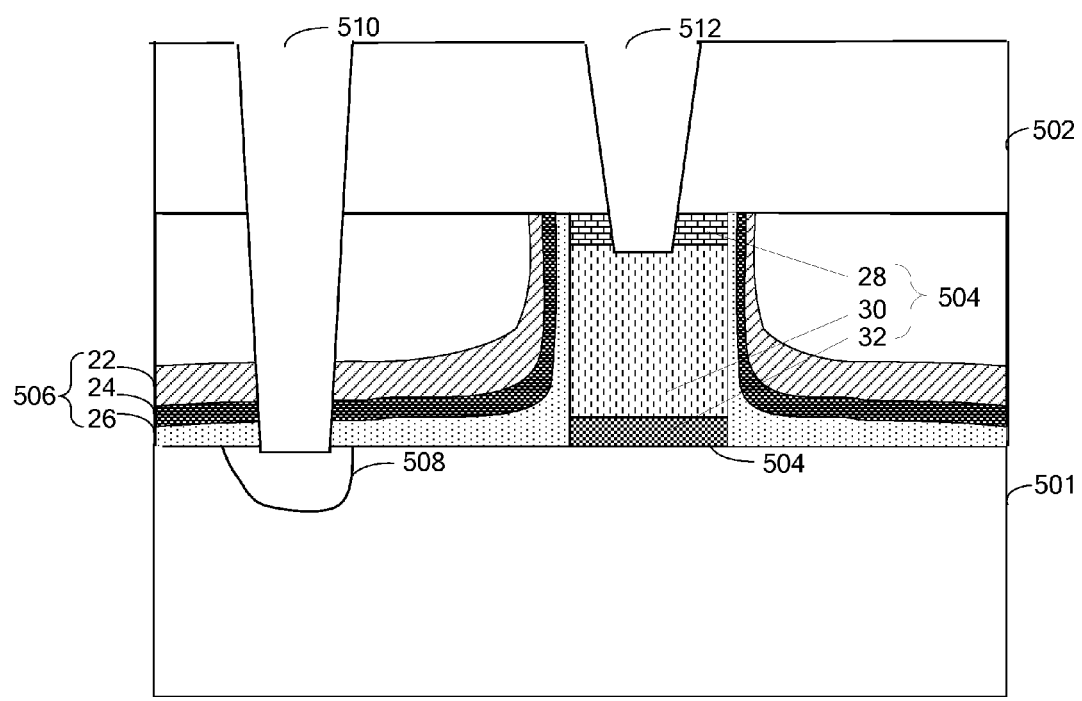

FIG. 5E is a sectional view of the semiconductor device after removing the second silicon nitride layer 26 remained at bottom of the contact hole 510 over the active area by a SiCoNi pre-clean process. As shown in FIG. 5E, after removing remained part of the second silicon nitride layer 26, the surface of the active area (e.g., metal silicide region 508) can be exposed. The contact holes 510 and 512 can be filled with a conductive material.

One advantage of the present invention is that the contact etch stop layer can protect the active area while removing the metal oxide on the metal gate, which can reduce the loss of the surface material of the active area exposed at bottom of the contact hole, and further improve the performance of the semiconductor device.

It is possible to carry out the method and system of the present invention in many ways. For example, it is possible to carry out the method and system of the present invention through software, hardware, firmware or any combination thereof. The above described order of the steps for the method is only intended to be illustrative, and the steps of the method of the present invention are not limited to the above specifically described order unless otherwise specifically stated. Besides, in some embodiments, the present invention may also be embodied as programs recorded in recording medium, including machine-readable instructions for implementing the method according to the present invention. Thus, the present invention also covers the recording medium which stores the program for implementing the method according to the present invention.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the present invention is defined by the attached claims.

What is claimed is:

1. A method of manufacturing a semiconductor device, said method comprising:
    forming a contact etch stop layer on an active area of a semiconductor substrate, wherein a gate stack having a metal gate and a metal oxide on the metal gate is formed on said semiconductor substrate, said contact etch stop layer including a first silicon nitride layer overlying a silicon oxide layer, a second silicon nitride layer overlying the active area, the silicon oxide layer being sandwiched between the first and second silicon nitride layers;
    forming a contact hole extending through an interlayer dielectric layer overlying said first silicon nitride layer by etching using said first silicon nitride layer as a protective layer for said active area;
    removing a portion of said first silicon nitride layer being exposed at the bottom of said contact hole using said silicon oxide layer as a protective layer for said active area; and
    removing the metal oxide on said metal gate using said second silicon nitride layer as a protective layer for said active area, wherein part of said second silicon nitride layer that overlaps said active area has a reduced remaining thickness as a result of said removing the metal oxide.

2. The method of claim 1, wherein said first silicon nitride layer has a thickness in a range of 200-400 Å, said second silicon nitride layer has a thickness in a range of 50-100 Å, and said silicon oxide layer has a thickness of 50-100 Å.

3. The method of claim 1, wherein removing a metal oxide on said metal gate comprising sputtering to form a hole through a metal oxide layer.

4. The method of claim 3, wherein the sputtering comprises a physical vapor deposition process including a radio frequency power in a range of 100-500 W, a bias voltage in a range of 100-300V, an argon flow rate in a range of 2-3 sccm, and a process time in a range of 10-100 seconds.

5. The method of claim 1, after removing the metal oxide on said metal gate, further comprising: removing a portion of said second silicon nitride layer being exposed at the bottom of said contact hole by a SiCoNi pre-clean process to expose a surface of said active area.

6. The method of claim 5, wherein said SiCoNi pre-clean process comprises a flow rate of fluorin nitride in a range of 10-30 sccm, a flow rate of ammonia in a range of 30-100 sccm, a pressure in a range of 2-10 Torr, a power of 10-100 w, and a process time in a range of 10-100 seconds.

7. The method of claim 5, wherein said active area comprises a preformed metal silicide region, and the exposed surface of said active area is formed in said metal silicide region.

8. The method of claim 5, wherein said SiCoNi pre-clean process comprises an oxide to silicon nitride selectivity ratio of less than 5:1.

9. A semiconductor device comprising:
    a semiconductor substrate having an active area;
    a gate stack including a metal oxide and a metal gate positioned between said metal oxide and said semiconductor substrate;
    a first silicon nitride layer; a second silicon nitride layer overlying the active area and directly contacting said metal oxide; a silicon oxide layer sandwiched between the first and second silicon nitride layers; and
    a contact hole through said contact etch stop layer, wherein said contact hole is formed over said active area.

10. The semiconductor device of claim 9, wherein said first silicon nitride layer has a thickness of 200-400 Å, said second silicon nitride layer has a thickness of 50-100 Å, said silicon oxide layer has a thickness of 50-100 Å.

11. The semiconductor device of claim 9, wherein said active area comprises a preformed metal silicide region, and said contact hole is formed over said metal silicide region.

12. The semiconductor device of claim 9, wherein said gate stack comprises a gate dielectric layer overlying the active area and said metal gate overlying said gate dielectric layer, and said gate dielectric layer comprises a high-k material.

13. The semiconductor device of claim 9, wherein said contact hole is filled with a conductive material.

14. A method of manufacturing a semiconductor device, said method comprising:
    forming a contact etch stop layer on an active area of a semiconductor substrate, wherein a gate stack having a metal gate and a metal oxide on the metal gate is formed on said semiconductor substrate, said contact etch stop layer including a first silicon nitride layer overlying a silicon oxide layer, a second silicon nitride layer overlying the active area, the silicon oxide layer being sandwiched between the first and second silicon nitride layers;
    forming a contact hole extending through an interlayer dielectric layer overlying said first silicon nitride layer by etching using said first silicon nitride layer as a protective layer for said active area;

removing a portion of said first silicon nitride layer being exposed at the bottom of said contact hole using said silicon oxide layer as a protective layer for said active area; and removing the metal oxide on said metal gate using said second silicon nitride layer as a protective layer for said active area, wherein said first silicon nitride layer has a thickness in a range of 200-400Å, said second silicon nitride layer has a thickness in a range of 50-100Å, and said silicon oxide layer has a thickness in a range of 50-100Å.

\* \* \* \* \*